(12) United States Patent
van der Straten et al.

(10) Patent No.: US 12,400,698 B2
(45) Date of Patent: Aug. 26, 2025

(54) MRAM DEVICE WITH OCTAGON PROFILE

(71) Applicant: INTERNATIONAL BUSINESS MACHINES CORPORATION, Armonk, NY (US)

(72) Inventors: Oscar van der Straten, Guilderland Center, NY (US); Chih-Chao Yang, Glenmont, NY (US); Koichi Motoyama, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 183 days.

(21) Appl. No.: 18/048,455

(22) Filed: Oct. 21, 2022

(65) Prior Publication Data

US 2024/0135978 A1 Apr. 25, 2024
US 2024/0233793 A9 Jul. 11, 2024

(51) Int. Cl.
*H10N 50/80* (2023.01)
*G11C 11/16* (2006.01)

(52) U.S. Cl.
CPC ................... *G11C 11/161* (2013.01)

(58) Field of Classification Search
CPC ...... G11C 11/161; H10B 61/00; H10N 50/80; H10N 50/10
See application file for complete search history.

(56) References Cited

U.S. PATENT DOCUMENTS

| | | | |
|---|---|---|---|
| 8,455,965 B2 | 6/2013 | Li | |
| 8,644,063 B2 | 2/2014 | Li | |
| 10,109,790 B2 | 10/2018 | Chuang | |
| 10,720,571 B2 | 7/2020 | Chuang | |
| 10,879,456 B2 | 12/2020 | Liou | |
| 10,971,682 B2 | 4/2021 | Peng | |
| 11,018,184 B2 | 5/2021 | Wang | |
| 11,037,990 B2 | 6/2021 | Chen | |
| 11,043,531 B2 | 6/2021 | Kalnitsky | |
| 11,183,627 B2 | 11/2021 | Chen | |
| 11,968,906 B2 * | 4/2024 | Chiou | H10N 50/85 |
| 2011/0037108 A1 * | 2/2011 | Sugiura | H10B 61/22 |
| | | | 257/295 |
| 2015/0056722 A1 | 2/2015 | Li | |
| 2017/0194557 A1 * | 7/2017 | Chuang | H10N 50/10 |

(Continued)

FOREIGN PATENT DOCUMENTS

CN 109994602 A 7/2019
WO 2009005788 A2 1/2009

*Primary Examiner* — Min Huang
(74) *Attorney, Agent, or Firm* — L. Jeffrey Kelly

(57) ABSTRACT

A magnetic tunnel junction cell, a cross section with octagon profile, vertically aligned layers of a top electrode, a free layer, a tunneling barrier, a reference layer, a bottom electrode with tapered side surface with a width at an upper surface greater than a width at a lower surface, the reference layer with vertical side surface perpendicular to an upper horizontal surface of the bottom electrode, the free layer and the tunneling barrier, each include a tapered side surface of the same angle, and each include a width at an upper surface less than a width at a lower surface. Forming a bottom electrode of a magnetic tunnel junction cell with a tapered side surface with a width at an upper surface greater than a width at a lower surface, forming a reference layer with vertical side surface perpendicular to an upper surface of the bottom electrode.

13 Claims, 14 Drawing Sheets

(56) References Cited

U.S. PATENT DOCUMENTS

| | | | | |
|---|---|---|---|---|
| 2020/0075843 | A1* | 3/2020 | Nagel | H10B 61/22 |
| 2020/0106009 | A1* | 4/2020 | Wu | H10N 50/01 |
| 2021/0143324 | A1* | 5/2021 | Lin | G11C 11/161 |
| 2022/0059759 | A1* | 2/2022 | Shen | H10B 61/00 |
| 2023/0200254 | A1* | 6/2023 | Chou | H10N 50/10 |
| | | | | 257/421 |

* cited by examiner

MRAM DEVICE WITH OCTAGON PROFILE

BACKGROUND

The present invention relates, generally, to the field of semiconductor manufacturing, and more particularly to fabricating a magnetic tunnel junction device with an octagon profile.

Magneto resistive random-access memory ("MRAM") devices are used as non-volatile computer memory. MRAM data is stored by magnetic storage elements. The elements are formed from two ferromagnetic layers, each of which can hold a magnetic field, separated by a spin conductor layer. One of the two layers is a reference magnet, or a reference layer, set to a particular polarity, while the remaining layer's field can be changed to match that of an external field to store memory and is termed the "free magnet" or "free-layer". This configuration is known as the magnetic tunnel junction (MTJ) and is the simplest structure for a MRAM bit of memory.

SUMMARY

According to an embodiment of the present invention, a semiconductor device is provided. The semiconductor device including a magnetic tunnel junction (MTJ) stack, where a cross section of the MTJ stack includes an octagon profile.

According to an embodiment of the present invention, a semiconductor device is provided. The semiconductor device including a magnetic tunnel junction (MTJ) stack, where a vertical side surface of the MTJ stack comprises an octagon profile, the MTJ stack includes vertically aligned layers of a top electrode, a free layer, a tunneling barrier, a reference layer and a bottom electrode, the bottom electrode includes a tapered side surface including a width at an upper surface of the bottom electrode greater than a width at a lower surface of the bottom electrode, the reference layer includes a vertical side surface perpendicular to an upper horizontal surface of the bottom electrode and the top electrode, the free layer and the tunneling barrier, each include a tapered side surface of the same angle, and each include a width at an upper surface less than a width at a lower surface.

According to an embodiment of the present invention, a method is provided. The method including forming a bottom electrode of a magnetic tunnel junction (MTJ) stack in a first dielectric, the bottom electrode includes a tapered side surface including a width at an upper surface of the bottom electrode greater than a width at a lower surface of the bottom electrode and forming a reference layer of the first magnetic tunnel function (MTJ) stack, the reference layer includes a vertical side surface perpendicular to an upper horizontal surface of the bottom electrode.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
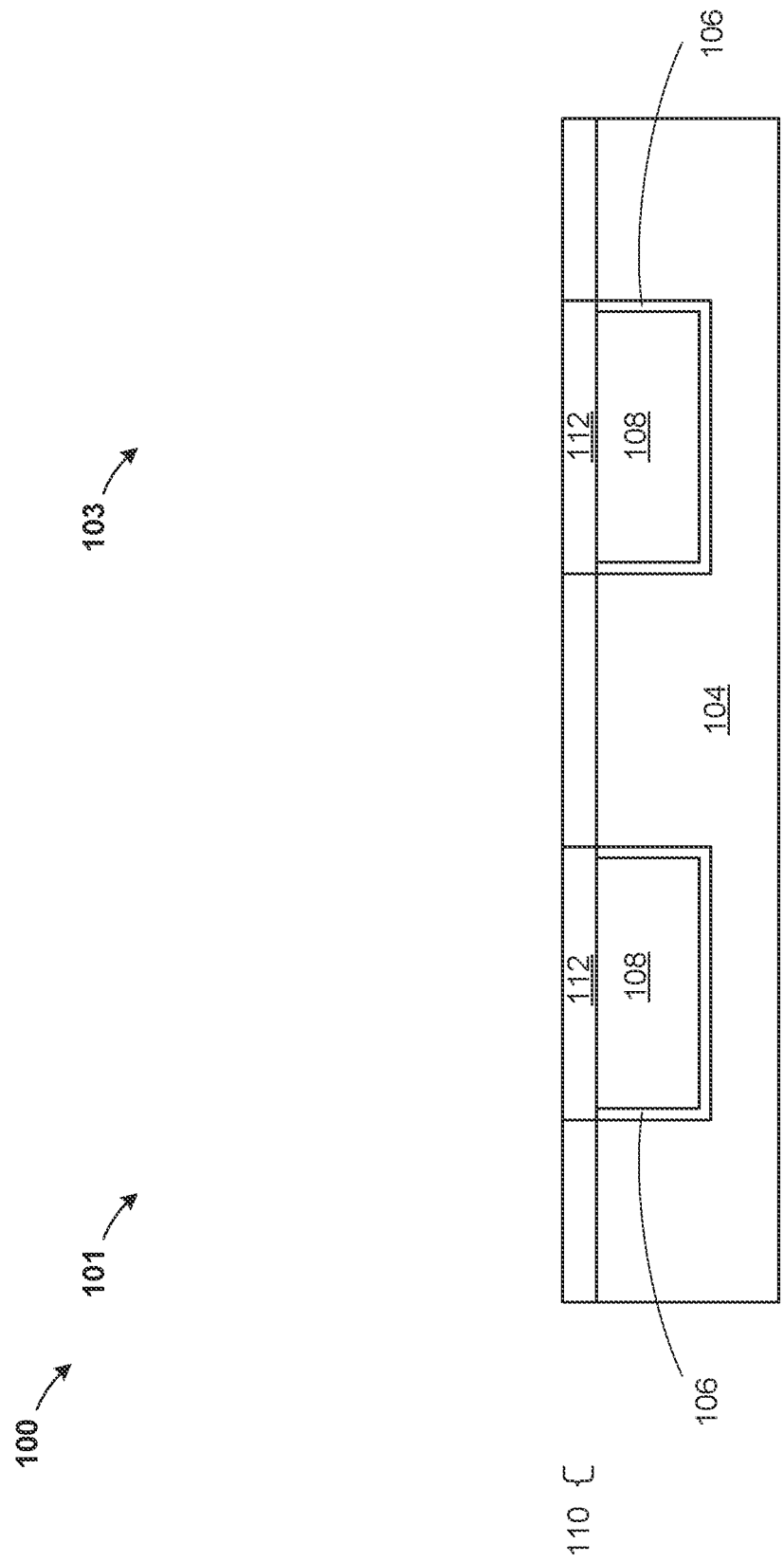
FIG. 1 illustrates a cross-sectional view of a multi-state memory cell, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As stated above, magneto resistive random-access memory (hereinafter "MRAM") devices are a non-volatile computer memory technology. MRAM data is stored by magnetic storage elements. The elements are formed from two ferromagnetic layers, each of which can hold a magnetic field, separated by a spin conductor layer. One of the two layers is a reference magnet, or a reference layer, set to a particular polarity, while the remaining layer's field can be changed to match that of an external field to store memory and is termed the "free magnet" or "free-layer". The magnetic reference layer may be referred to as a reference layer, and the remaining layer may be referred to as a free layer. This configuration is known as the magnetic tunnel junction (hereinafter "MTJ") and is the simplest structure for a MRAM bit of memory.

A memory device is built from a grid of such memory cells or bits. In some configurations of MRAM, such as the type further discussed herein, the magnetization of the magnetic reference layer is fixed in one direction (up or down), and the direction of the magnetic free layer can be switched by external forces, such as an external magnetic field or a spin-transfer torque generating charge current. A smaller current (of either polarity) can be used to read resistance of the device, which depends on relative orientations of the magnetizations of the magnetic free layer and the magnetic reference layer. The resistance is typically higher which the magnetizations are anti-parallel and lower when they are parallel, though this can be reversed, depending on materials used in fabrication of the MRAM.

The MRAM stack layers may be conformally formed using known techniques. In formation of the MTJ stacks layers, the reference layer is formed on a dielectric and a bottom electrode. The tunneling barrier layer is formed on the reference layer. In an embodiment, the tunneling barrier layer is a barrier, such as a thin insulating layer or electric potential, between two electrically conducting materials. Electrons (or quasiparticles) pass through the tunneling barrier layer by the process of quantum tunneling. In certain embodiments, the tunneling barrier layer includes at least one sublayer composed of magnesium oxide (MgO). It should be appreciated that materials other than MgO can be used to form the tunneling barrier layer. The free layer is a magnetic free layer that is adjacent to tunneling barrier layer and opposite the reference layer. The free layer has a magnetic moment or magnetization that can be flipped. It should also be appreciated that the MTJ stack layers may include additional layers, omit certain layers, and each of the layers may include any number of sublayers. Moreover, the composition of layers and/or sublayers may be different between the different MRAM stacks.

For high performance MRAM devices based on perpendicular magnetic tunnel junction (MTJ) structures, well-defined interfaces and interface control are essential. MTJ structures typically include a cobalt (Co) based synthetic anti-ferromagnet (SAF), a CoFeB-based reference layer, a MgO-based tunnel barrier, a CoFeB-based free layer, and cap layers containing e.g. tantalum (Ta) and/or ruthenium (Ru). Embedded MTJ structures are usually formed by subtractive patterning of blanket MTJ stacks into pillars between two metal levels. In this invention, after each layer of MTJ stack patterning, inter-pillar spaces are filled with inter-layer dielectric (hereinafter "ILD") to enable connection to BEOL wiring by a top contact level without voids in the ILD. ILD gap fill between pillars presents a significant challenge since the presence of voids in the ILD between the pillars can lead to shorts.

The present invention relates to fabricating a MTJ device with outwardly tapered vertical side surface of the top electrode, the free layer and the tunneling barrier, when moving from an upper surface to a lower surface of the MTJ device, and an inwardly tapered vertically side surface of a bottom electrode, when moving from an upper surface to a lower surface of the MTJ device, resulting in an octagon side profile of the MTJ device. Forming the octagon side profile of the MTJ device helps to reduce gaps in the ILD surrounding the devices as three separately formed ILDs, each for a lower height than forming a single ILD, surround an entire vertical side surface of the MTJ device. Additionally, when forming the uppermost ILD, a lower surface of the uppermost ILD has a smaller area than an upper surface of the uppermost ILD, helping to reduce formation of voids. The MTJ device with individually formed layers improved MRAM performance due to reduced shorts between top contacts of adjacent MTJ device pillars.

For high performance MRAM devices based on perpendicular magnetic tunnel junction (MTJ) structures, well-defined interfaces and interface control are essential. MTJ structures typically include a Co-based synthetic anti-ferromagnet (SAF), a CoFeB-based reference layer, a MgO-based tunnel barrier, a CoFeB-based free layer, and cap layers containing e.g. Ta and/or Ru. Embedded MTJ structures are usually formed by subtractive patterning of blanket MTJ stacks into pillars between two metal levels. After MTJ stack patterning, the inter-pillar spaces are filled with an inter-layer dielectric (ILD) to enable connection to BEOL wiring by a top contact level. ILD gap fill between pillars presents a significant challenge since the presence of voids in the ILD between the pillars can lead to shorts. When forming the ILD, voids may occur between adjacent MTJ stacks. The voids may then become filled with material intended to form a top contact for each MTJ stack. The filled voids may cause shorts between adjacent top contacts of adjacent MTJ stacks. There is a need for embedded MTJ structures formed with a reduced risk of ILD void induced shorts.

An MRAM pillar having an octagon profile helps to reduce ILD voiding between adjacent MTJ stacks. This helps to extend scalability of MRAM device memory elements due to void-free gap fill between MRAM pillars and improved embedded MRAM performance due to reduced top contact shorts.

In an embodiment, a bottom electrode may be formed on a lower metal wire in an opening of a first inter-layer dielectric. The bottom electrode may have a wider upper surface than a lower surface, such that sidewalls of the bottom electrode are angled or flare outward. A reference layer may be formed conformally and then patterned such that sidewalls of the reference layer are generally vertically aligned above the bottom electrode, and perpendicular to an upper surface of the lower metal wire. The vertical sidewall of the reference layer may have a sidewall angle, with a value of 90 degrees in an embodiment. A first encapsulation layer may be formed and patterned such that the first encapsulation layer surrounds vertical sidewalls of the reference layer. A second inter-layer dielectric may be formed surrounding the reference layer and the first encapsulation layer of each MTJ stack. A tunneling barrier, a free layer and material for a top electrode may each be conformally formed on the second inter-layer dielectric, the first encapsulation layer and the reference layer. Portions of the tunneling barrier, the free layer and the material for the top electrode may be removed such that sidewalls of the tunneling barrier, the free layer and the top electrode remain in each MTJ stack. Each layer of the tunneling barrier, the free layer and the top electrode have a wider upper surface than a lower surface, or angled or flared outward when traveling from an upper most surface to a lower surface of the MTJ stack. Vertical sidewalls of the tunneling barrier, the free layer and the top electrode may each have the same sidewall angle, which may range between 10 and 50 degrees in an embodiment. A second encapsulation layer may be formed and patterned such that the first encapsulation layer surrounds vertical sidewalls of the tunneling barrier, the free layer and the top electrode. A third inter-layer dielectric may be formed surrounding the tunneling barrier and the free layer and above the MTJ stacks. An upper metal wire may be formed in vertically aligned openings in the inter-layer dielectric above the top electrode, the free layer, the tunneling barrier the reference layer, the bottom electrode and the lower metal wire. The resulting MTJ stack has an octagon side profile. Vertical side surfaces of the top electrode, the free layer and the tunneling barrier may flare outward, when moving from an upper surface to a lower surface of the MTJ stack. The reference layer may have a vertical side surface which is essentially perpendicular to a lower surface of the MTJ stack. The bottom electrode may have a vertical side surface which flares inward, when moving from an upper surface to a lower surface of the MTJ stack.

In an embodiment, the first and the second encapsulation layer may contain the same material. In an alternate embodiment, the first and the second encapsulation layer may each contain different materials. In an embodiment, either or both of the first and the second encapsulation layer may contain silicon nitride (SiN) or silicon nitride carbon (SiNC). In an embodiment, the first encapsulation layer may contain zirconium oxide (ZrO$_2$). Materials for the first, second and third inter-layer dielectric may contain the same material. In an alternate embodiment, the first, second and third inter-layer dielectric may each contain different material. The first, second and third inter-layer dielectric may each include SiCOH, SiCNO and SiCHNO.

Referring now to FIG. 1, a semiconductor structure 100 (hereinafter "structure") at an intermediate stage of fabrication is shown according to an exemplary embodiment. FIG. 1 is a cross-sectional view of the structure 100. The structure 100 may be formed or provided. The structure 100 may include a cell 101 and a cell 103. The cells 101, 103, each includes, for example, an inter-layer dielectric (hereinafter "ILD") 104, a liner 106, a lower metal wire 108, an inter-layer dielectric (hereinafter "ILD") 110, and a metal cap 112.

The structure 100 may include several back end of line ("BEOL") layers. In general, the back end of line (BEOL) is the second portion of integrated circuit fabrication where the individual devices (transistors, capacitors, resistors, etc.) are interconnected with wiring on the wafer.

The ILD 104 may be formed by depositing or growing a dielectric material on the BEOL layers, followed by a chemical mechanical polishing (CMP) or etch steps. The ILD 104 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by a planarization process, such as CMP, or any suitable etch process. In an embodiment, the ILD 104 may include one or more layers. In an embodiment, the ILD 104 may include any dielectric material such as silicon oxide (SiOx), silicon nitride (SiNx), silicon boron carbonitride (SiBCN), NBLoK, a low-k dielectric material (with k<4.0), including but not limited to, silicon oxide, spin-on-glass, a flowable oxide, a high-density plasma oxide, borophosphosilicate glass (BPSG), or any combination thereof or any other suitable dielectric material.

The lower metal wire 108 may be formed by first patterning two or more trenches (not shown) into the ILD 104, lining the two or more trenches with the liner 106, and filling the two or more trenches.

The liner 106 separates the conductive interconnect material of the lower metal wire 108 from the ILD 104. The liner 106 may be composed of, for example, tantalum nitride (TaN), tantalum (Ta), titanium (Ti), titanium nitride (TiN), or a combination thereof. The liner 106 may be deposited utilizing a conventional deposition process such as, for example, CVD, plasma enhanced chemical vapor deposition (PECVD), PVD or ALD. The liner 106 may be 5 nm thick, although a thickness less than or greater than 5 nm may be acceptable. The liner 106 surrounds a lower horizontal surface and a vertical side surface of the lower metal wire 108.

In an embodiment, the lower metal wire 108 is formed from a conductive material layer which is blanket deposited on top of the structure 100, and directly on a top surface of the liner 106, filling the two or more trenches (not shown). The conductive material layer may include materials such as, for example copper (Cu), ruthenium (Ru), cobalt (Co), tungsten (W). The conductive material can be formed by for example, chemical vapor deposition (CVD), physical vapor deposition (PVD), and atomic layer deposition (ALD) or a combination thereof. The lower metal wire 108 is formed by damascene, or patterned from the conductive material layer, using known patterning and etching techniques. There may be any number of openings in the ILD 104, each filled with the liner 106 and the lower metal wire 108, on the structure 100.

A planarization process, such as, for example, chemical mechanical polishing (CMP), may be done to remove excess material from a top surface of the structure 100 such that upper horizontal surfaces of the lower metal wire 108, the liner 106 and the ILD 104 are coplanar.

In an embodiment, the lower metal wire 108 may have a thickness ranging from about 10 nm to about 100 nm, although a thickness less than 10 nm and greater than 100 nm may be acceptable.

The ILD 110 may be formed as described for the ILD 104, directly on a top surface of the liner 106, the lower metal wire 108 and the ILD 104. The metal cap 112 may be formed by first patterning two or more second trenches (not shown) into the ILD 110 vertically aligned above the lower metal wire 108 and the liner 106, and filling the two or more second trenches. The ILD 110 is unlikely to contain voids as the ILD 110 is blanket deposited on the planarized upper surface of the lower metal wire 108 and the liner 106.

In an embodiment, the metal cap 112 is formed from a conductive material layer which is blanket deposited on top of the structure 100, and directly on a top surface of the ILD 110, the liner 106, the lower metal wire 108 and the ILD 104. The conductive material layer may include materials such as, for example tantalum (Ta), ruthenium (Ru), titanium (Ti), tungsten (W). The conductive material can be formed by for example, chemical vapor deposition (CVD), physical vapor deposition (PVD), and atomic layer deposition (ALD) or a combination thereof. The metal cap 112 is formed by damascene, or patterned from the conductive material layer, using known patterning and etching techniques. Damascene is the method of BEOL interconnect formation. A dielectric is deposited, patterned, and the resulting feature is metallized. Any metal overburden is removed by planarization.

A planarization process, such as, for example, chemical mechanical polishing (CMP), may be done to remove excess material from a top surface of the structure 100 such that upper horizontal surfaces of the metal cap 112 and the ILD 110 are coplanar.

Figure 2:
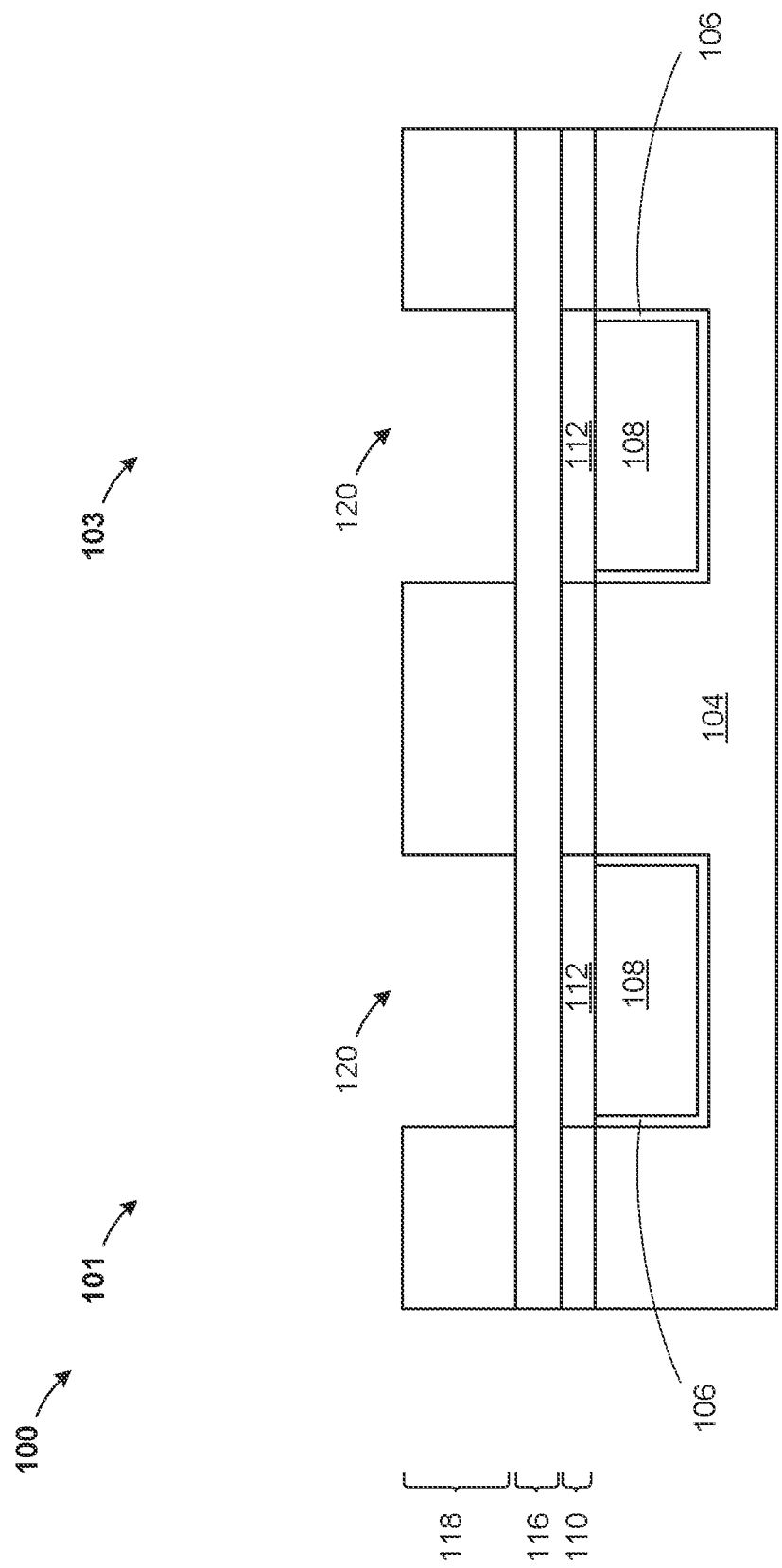
FIG. 2 illustrates a cross-sectional view of the multi-state memory cell and illustrates formation of an inter-layer dielectric and a hard mask, according to an exemplary embodiment.

Referring now to FIG. 2, a cross-sectional view of the structure 100 is shown, according to an embodiment. An inter-layer dielectric (hereinafter "ILD") 116 and a hard mask 118 may be formed.

The ILD 116 may be formed as described for the ILD 104, directly on upper horizontal surfaces of the metal cap 112 and the ILD 110. The ILD 116 is unlikely to contain voids as the ILD 116 is blanket deposited on the planarized upper surface of the metal cap 112 and the ILD 110.

The hard mask 118 may formed on the structure 100 and patterned, directly on an upper horizontal surface of the ILD 116. The hard mask 118 may be patterned such that portions of the hard mask 118 are removed, forming an opening 120. The opening 120 may be vertical aligned above the metal cap 112 and the lower metal wire 108, in each of the cells 101, 103.

Figure 3:
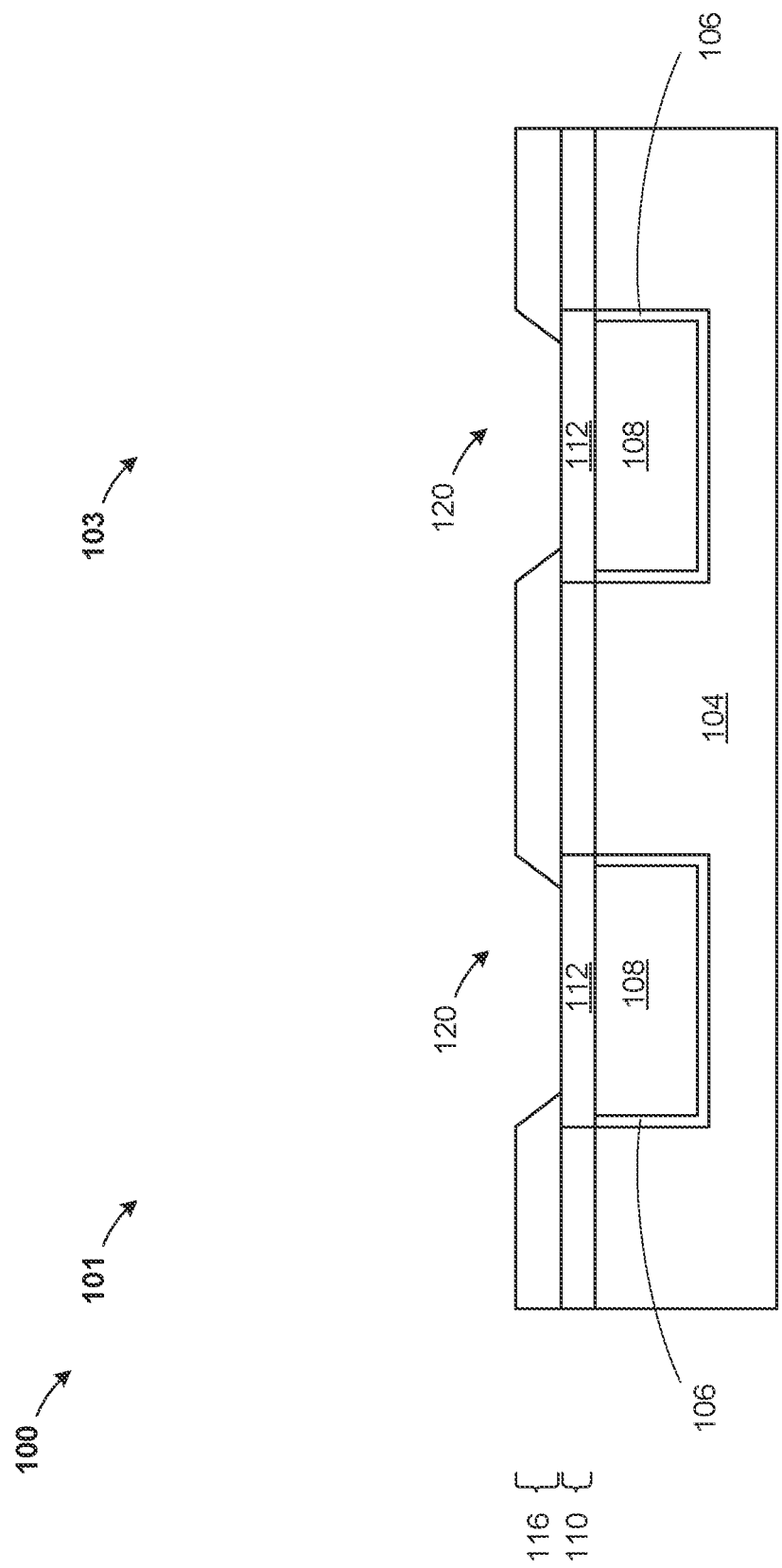
FIG. 3 illustrates a cross-sectional view of the multi-state memory cell and illustrates patterning of the inter-layer dielectric and removal of the hard mask, according to an exemplary embodiment.

Referring now to FIG. 3, a cross-sectional view of the structure 100 is shown, according to an embodiment. Portions of the ILD 116 may be removed. The hard mask 118 may be removed.

The portions of the ILD 116 may be removed exposing an upper surface of the metal cap 112. The portions of the ILD 116 may be selectively removed using an anisotropic etching technique, such as, for example, reactive ion etching, extending the openings 120. The portions of the ILD 116 may be etched such that the ILD 116 may have a tapered side surface, with a width of the opening 120 more narrow at a lower surface closer to the metal cap 112 and a width more width at an upper surface of the opening 120.

The hard mask 118 may be removed using known techniques.

Figure 4:
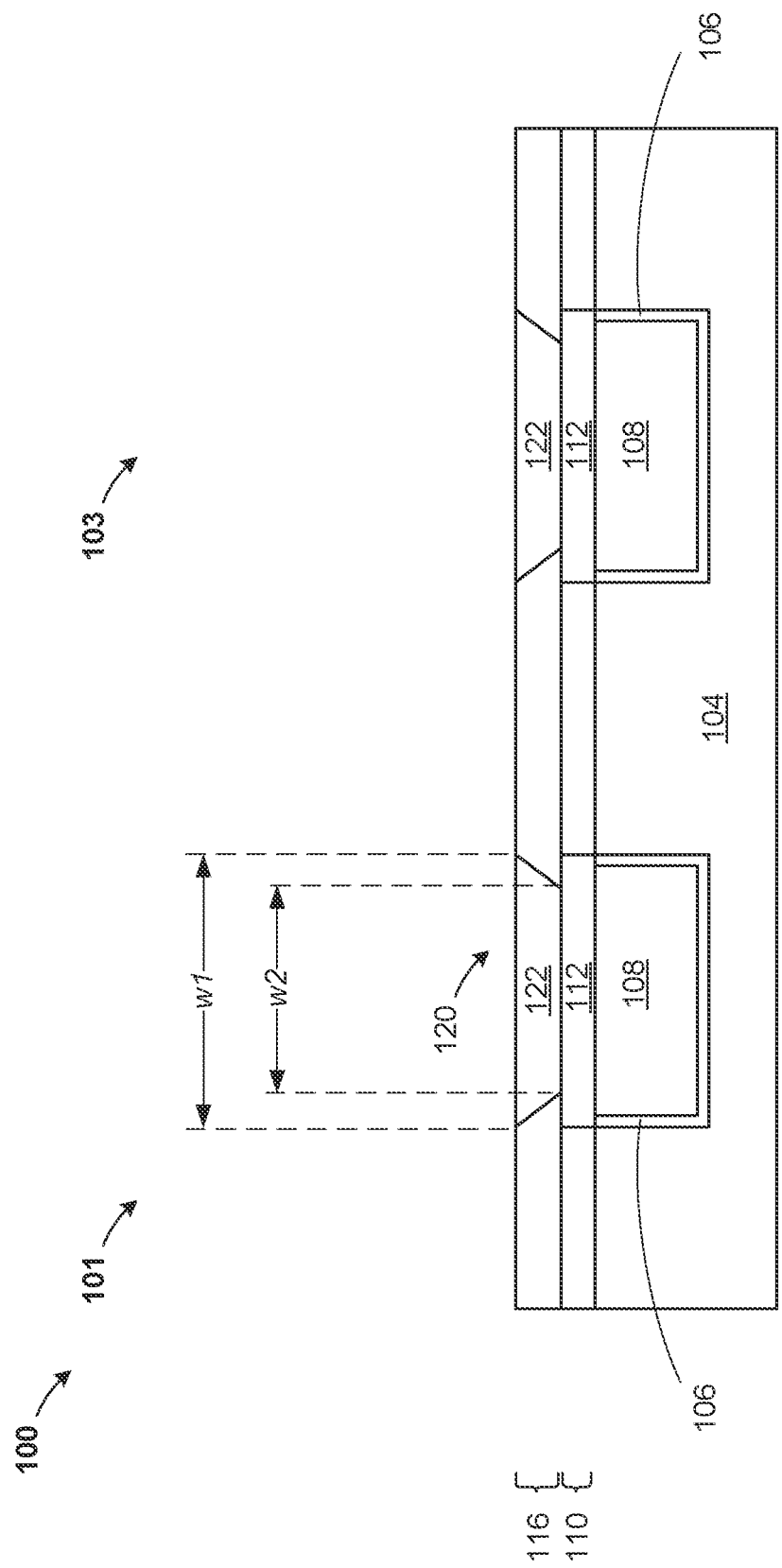
FIG. 4 illustrates a cross-sectional view of the multi-state memory cell and illustrates formation of a bottom electrode, according to an exemplary embodiment.

Referring now to FIG. 4, a cross-sectional view of the structure 100 is shown, according to an embodiment. A bottom electrode 122 may be formed.

In an embodiment, the bottom electrode 122 is formed from a conductive material layer which is blanket deposited on top of the structure 100, and directly on a top surface of the metal cap 112 and the ILD 116. The conductive material layer may include materials such as, for example, tantalum nitride (TaN), tantalum (Ta), titanium (Ti), titanium nitride (TiN). The conductive material layer may be deposited using typical deposition techniques, for example, physical vapor deposition, atomic layer deposition, molecular layer deposition, and chemical vapor deposition. A planarization process, such as, for example, chemical mechanical polishing (CMP), may be done to remove excess material from a top surface of the structure 100 such that upper horizontal surfaces of the bottom electrode 122 and the ILD 116 are coplanar.

In an embodiment, the bottom electrode 122 may have a thickness ranging from about 10 nm to about 100 nm, although a thickness less than 10 nm and greater than 100 nm may be acceptable. The bottom electrode 122 may have a tapered side surface, with a width of the bottom electrode 122 at a lower surface closer to the lower metal wire 108, w2, smaller than a width at an upper surface of the bottom electrode 122, w1.

Vertical sidewalls of the bottom electrode 122 may have a sidewall angle which may range between 10 and 50 degrees in an embodiment.

Figure 5:
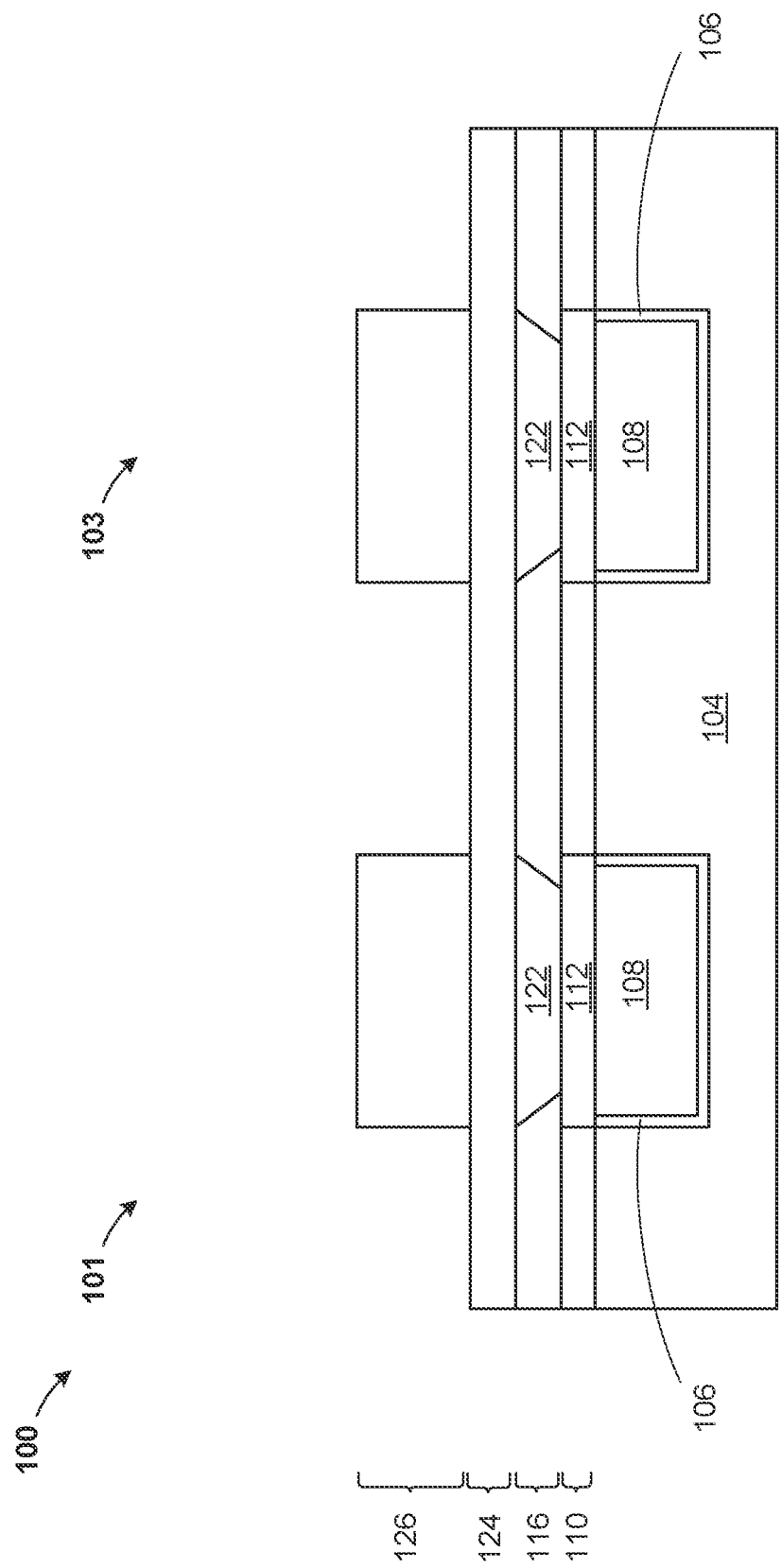
FIG. 5 illustrates a cross-sectional view of the multi-state memory cell and illustrates formation of a reference layer and a hard mask, according to an exemplary embodiment.

Referring now to FIG. 5, a cross-sectional view of the structure 100 is shown, according to an embodiment. A reference layer 124 may be formed. A hard mask 126 may be formed.

The reference layer 124 may be formed conformally on the structure 100. The reference layer 124 may cover an upper horizontal surface of the ILD 116 and an upper horizontal surface of the bottom electrode 122.

The hard mask 126 may formed on the structure 100 and patterned, directly on an upper horizontal surface of the reference layer 124. The hard mask 126 may be patterned such that portions of the hard mask 126 are removed, and remaining portions of the hard mask 126 are vertically aligned above the bottom electrode 122, the metal cap 112 and the lower metal wire 108, in both of the cells 101, 103.

Figure 6:
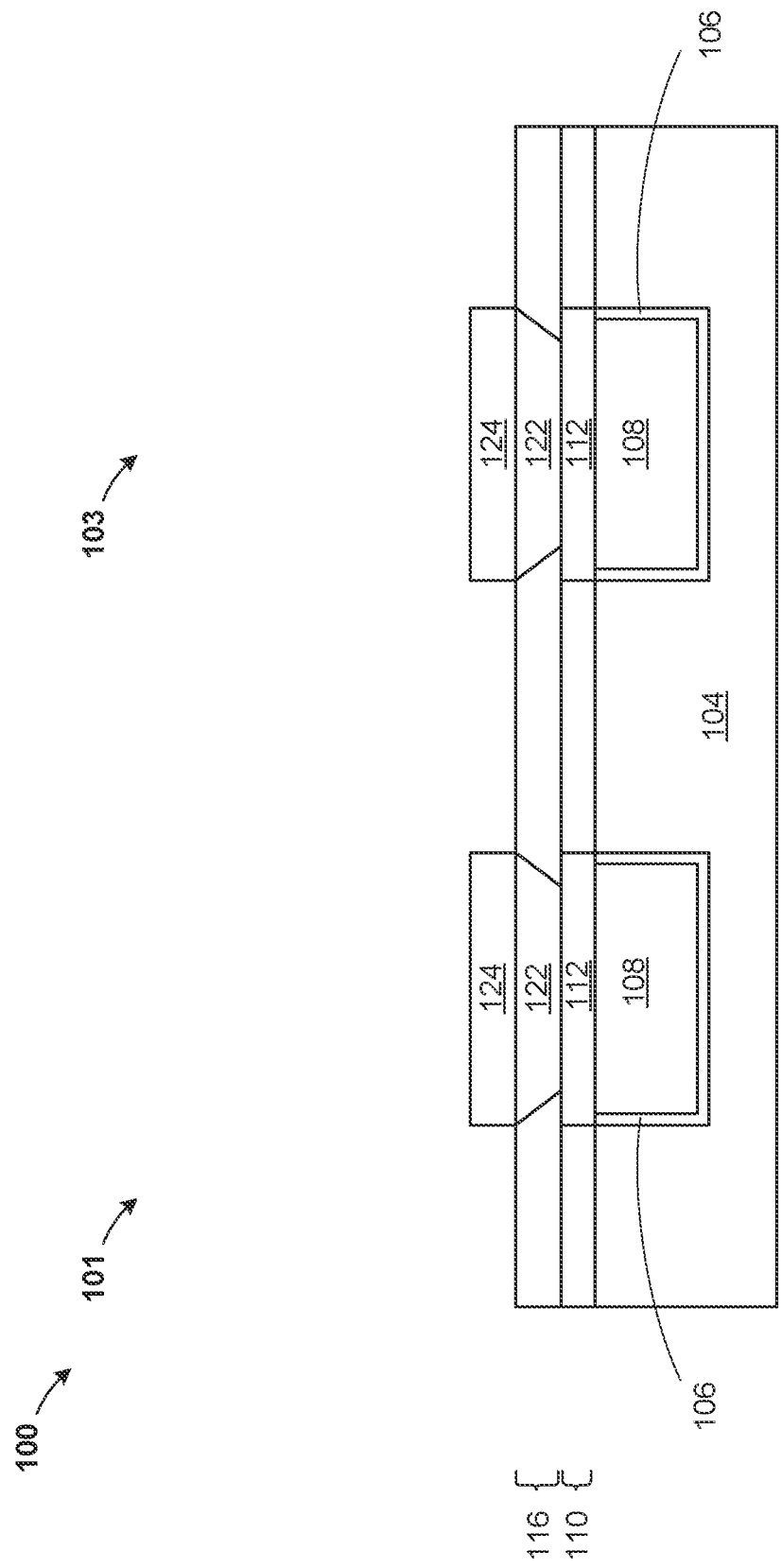
FIG. 6 illustrates a cross-sectional view of the multi-state memory cell and illustrates patterning of the reference layer and removal of the hard mask, according to an exemplary embodiment.

Referring now to FIG. 6, a cross-sectional view of the structure 100 is shown, according to an embodiment. Portions of the reference layer 124 may be removed. The hard mask 126 may be removed.

Portions of the reference layer 124 may be removed selective to the hard mask 126. The portions of the reference layer 124 may be selectively removed using an anisotropic etching technique, such as, for example, reactive ion etching. The remaining portions of the reference layer 124 may remain vertically aligned above the bottom electrode 122, the metal cap 112 and the lower metal wire 108, in both the cells 101, 103, and perpendicular to an upper surface of the lower metal wire 108.

The hard mask 126 may be removed using known techniques.

Figure 7:
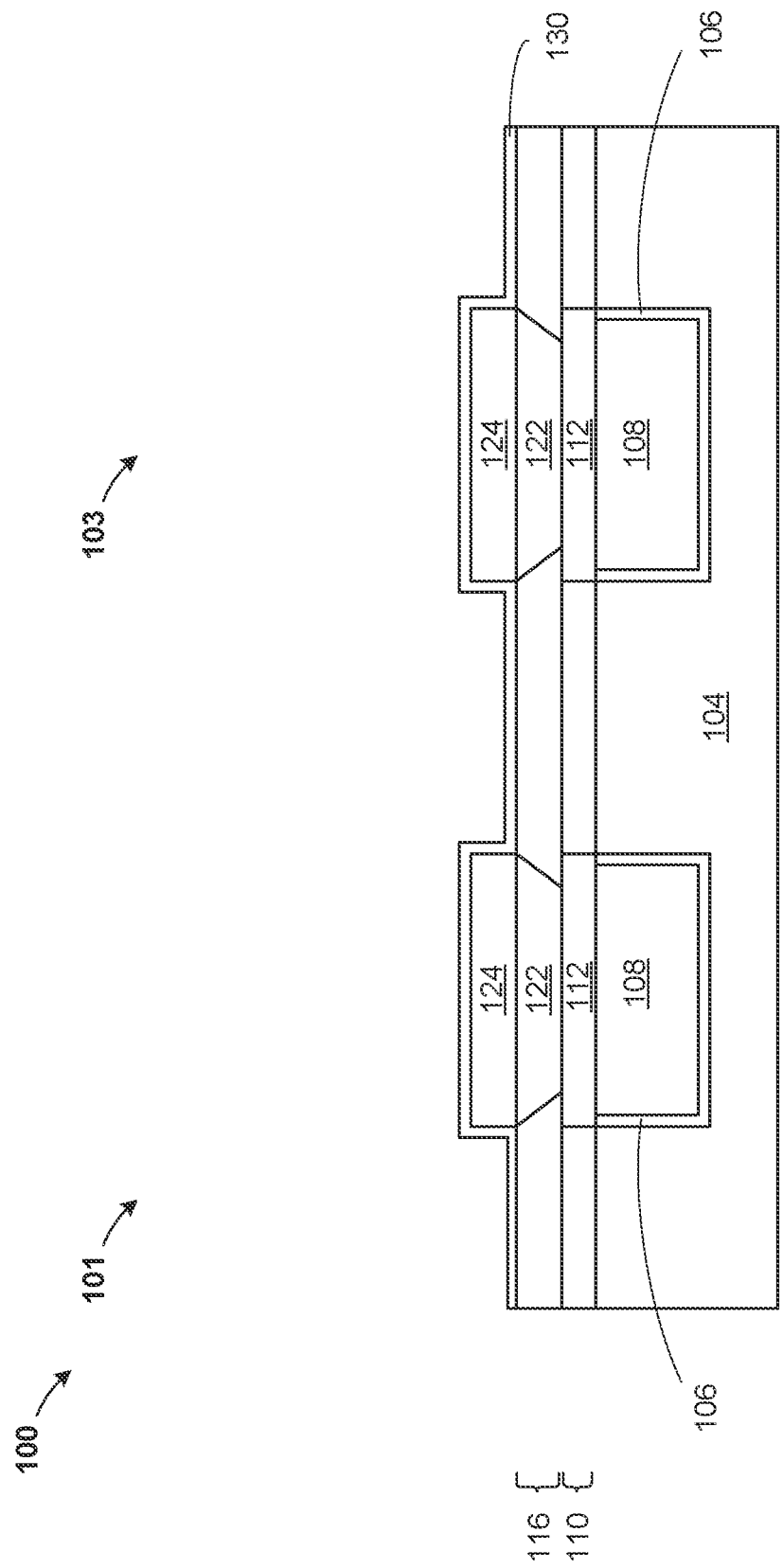
FIG. 7 illustrates a cross-sectional view of the multi-state memory cell and illustrates formation of a first encapsulation layer, according to an exemplary embodiment.

Referring now to FIG. 7, a cross-sectional view of the structure 100 is shown, according to an embodiment. A first encapsulation layer 130 may be formed.

The first encapsulation layer 130 may be conformally formed on the structure 100, on an upper horizontal surface of the ILD 116, and on an upper horizontal surface and vertical side surfaces of the reference layer 124. The first encapsulation layer 130 may include materials such as, for example, any dielectric material such as silicon nitride (SiN) and silicon nitride carbon (SiNC) and may include a single layer or may include multiple layers of dielectric material. In an alternate embodiment, the first encapsulation layer 130 may include zirconium oxide ($ZrO_2$). The first encapsulation layer 130 may be deposited using typical deposition techniques, for example, physical vapor deposition, atomic layer deposition, molecular layer deposition, and chemical vapor deposition. The first encapsulation layer 130 may have a thickness between 3 nm and 30 nm, although thickness greater than 30 nm or less than 3 nm are acceptable.

The first encapsulation layer 130 helps to protect the reference layer from being damaged or oxidized during subsequent ILD materials deposition.

Figure 8:
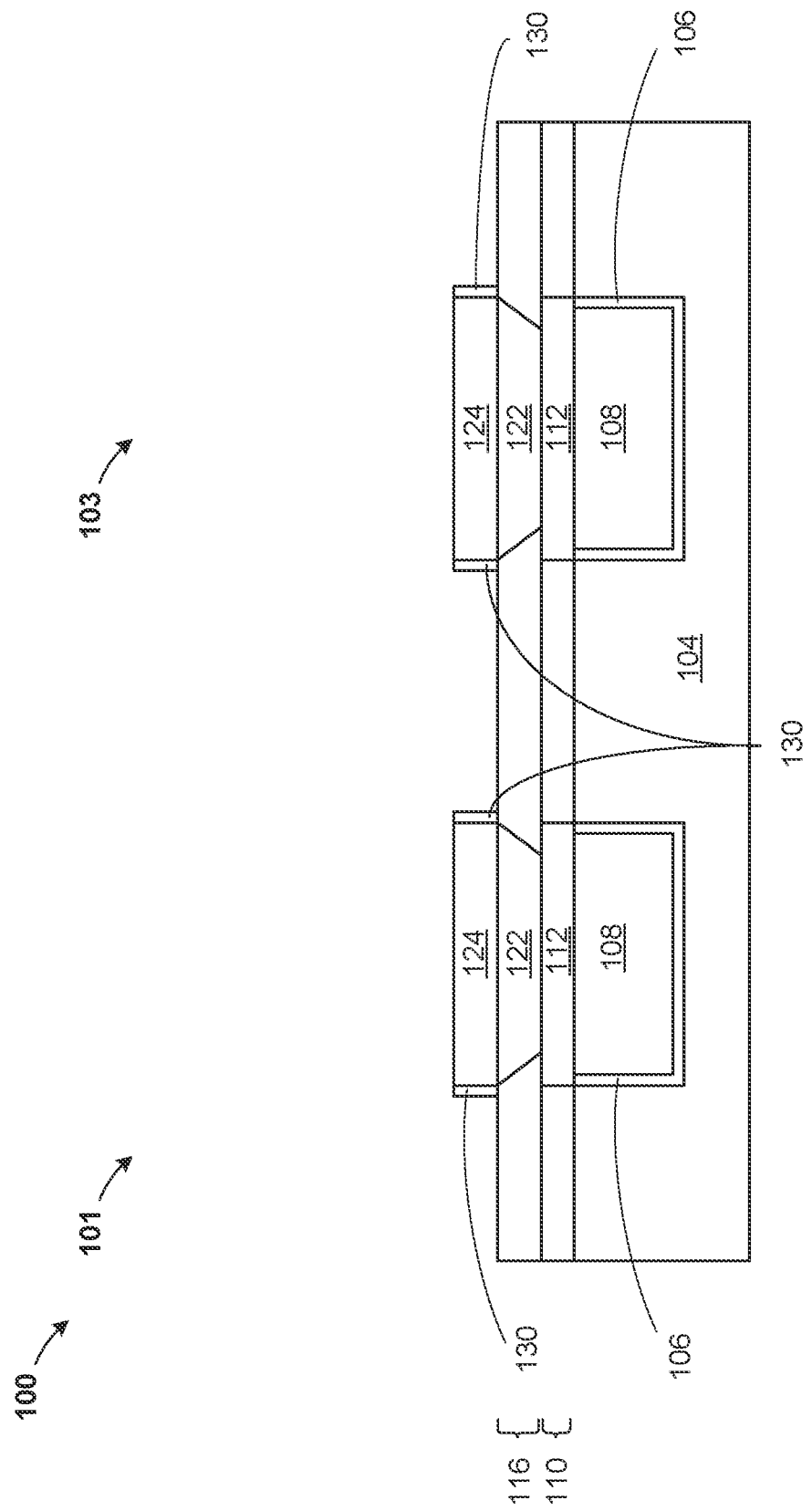
FIG. 8 illustrates a cross-sectional view of the multi-state memory cell and illustrates removal of portions of the first encapsulation layer, according to an exemplary embodiment.

Referring now to FIG. 8, a cross-sectional view of the structure 100 is shown, according to an embodiment. Portions of the first encapsulation layer 130 may be removed.

The portions of the first encapsulation layer 130 may be selectively removed using an anisotropic etching technique, such as, for example, reactive ion etching. The remaining portions of the first encapsulation layer 130 may remain vertically aligned directly adjacent to the reference layer 124, in both the cells 101, 103. The first encapsulation layer 130 may be removed from upper horizontal surfaces of the reference layer 124 and the ILD 116.

Figure 9:
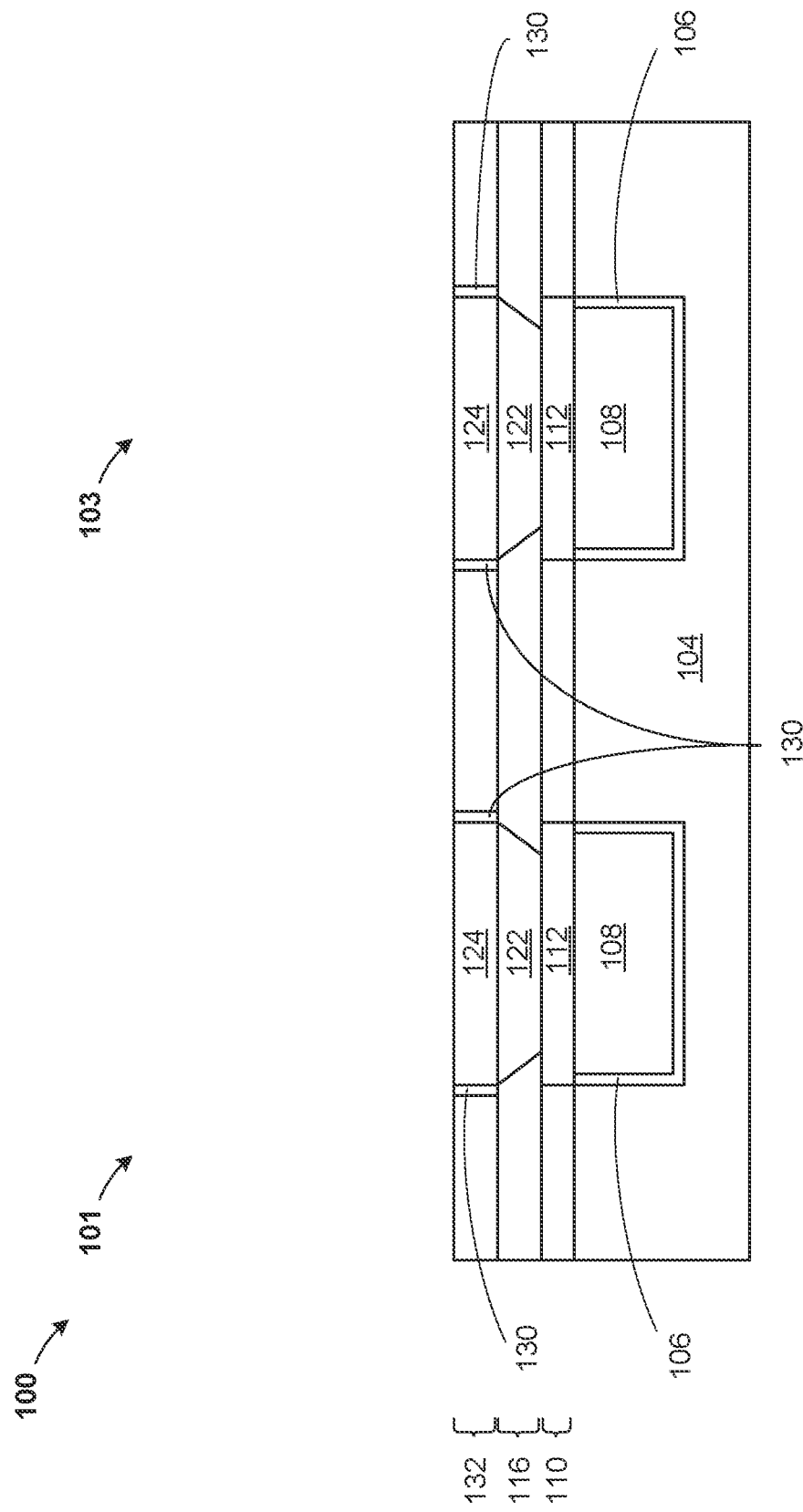
FIG. 9 illustrates a cross-sectional view of the multi-state memory cell and illustrates formation of an inter-layer dielectric, according to an exemplary embodiment.

Referring now to FIG. 9, a cross-sectional view of the structure 100 is shown, according to an embodiment. An inter-layer dielectric (hereinafter "ILD") 132 may be formed.

The ILD 132 may be formed as described for the ILD 104, conformally on the structure 100, covering upper horizontal surfaces of the first encapsulation layer 130, the reference layer 124 and the ILD 116 and vertical side surfaces of the first encapsulation layer 130. The ILD 132 is unlikely to contain voids as the ILD 132 is blanket deposited on the structure 100 and fills openings between adjacent reference layers 124 and the first encapsulation layer 130 between cells 101, 103. This is less likely to contain voids than forming an inter-layer dielectric surrounding multiple layers of the cell 101, 103.

A planarization process, such as, for example, chemical mechanical polishing (CMP), may be done to remove excess material from a top surface of the structure 100 such that upper horizontal surfaces of the ILD 132, the reference layer 124 and the first encapsulation layer 130 are coplanar.

Figure 10:
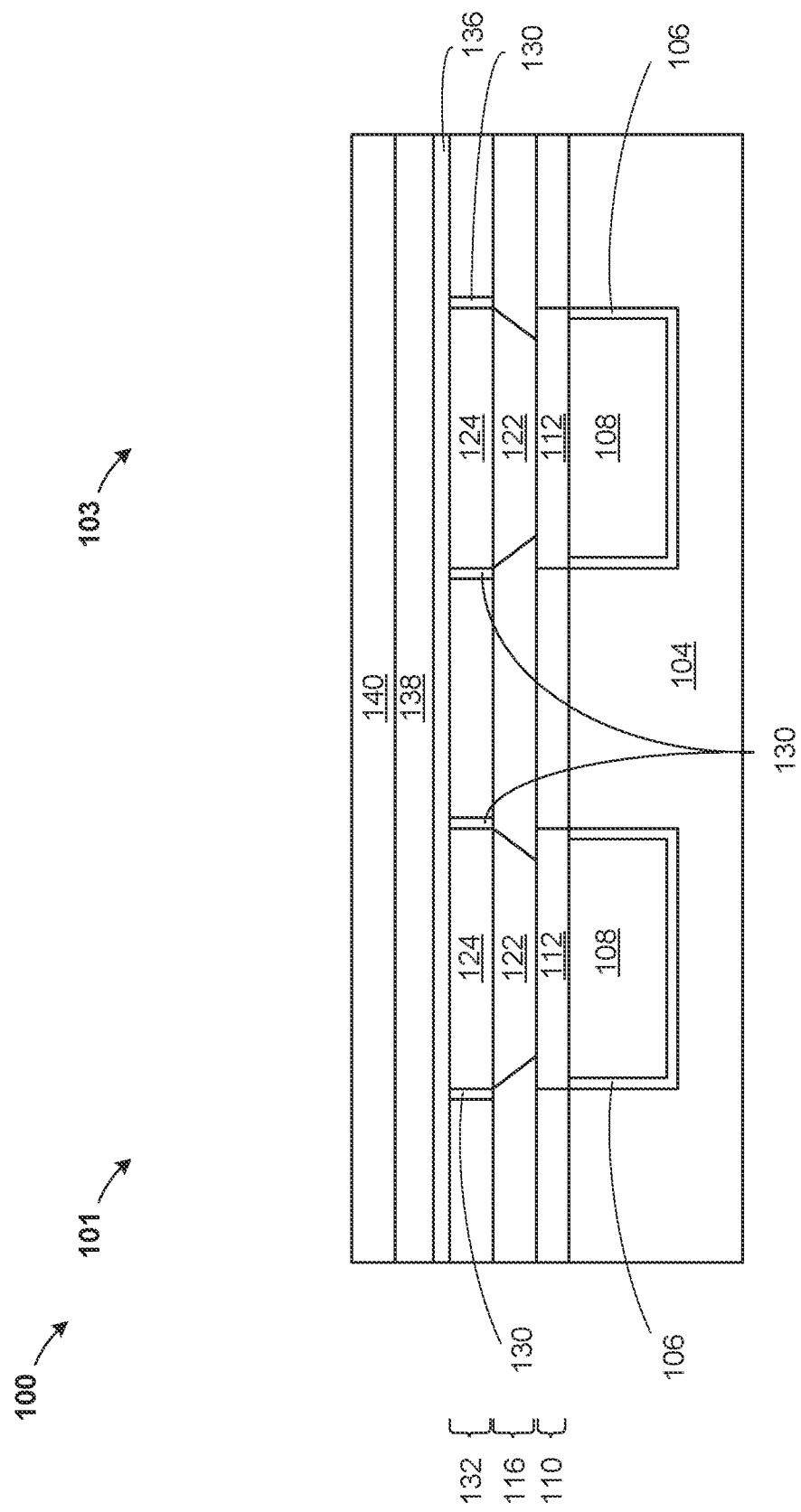
FIG. 10 illustrates a cross-sectional view of the multi-state memory cell and illustrates formation of a tunneling barrier and a free layer and a top electrode, according to an exemplary embodiment.

Referring now to FIG. 10, a cross-sectional view of the structure 100 is shown, according to an embodiment. A tunneling barrier 136 may be formed. A free layer 138 may be formed. A top electrode 140 may be formed.

The tunneling barrier 136 may be formed conformally on the structure 100, on upper horizontal surfaces of the ILD 132, the reference layer 124 and the first encapsulation layer 130.

The free layer 138 may be formed conformally on the structure 100, on upper horizontal surfaces of the tunneling barrier 136.

The top electrode 140 is formed from a conductive material layer which is blanket deposited on top of the structure 100, and directly on a top surface of the free layer 138. The conductive material layer may include materials such as, for example, tantalum nitride (TaN), tantalum (Ta), titanium (Ti), titanium nitride (TiN). The conductive material layer may be deposited using typical deposition techniques, for example, physical vapor deposition, atomic layer deposition, molecular layer deposition, and chemical vapor deposition.

Figure 11:
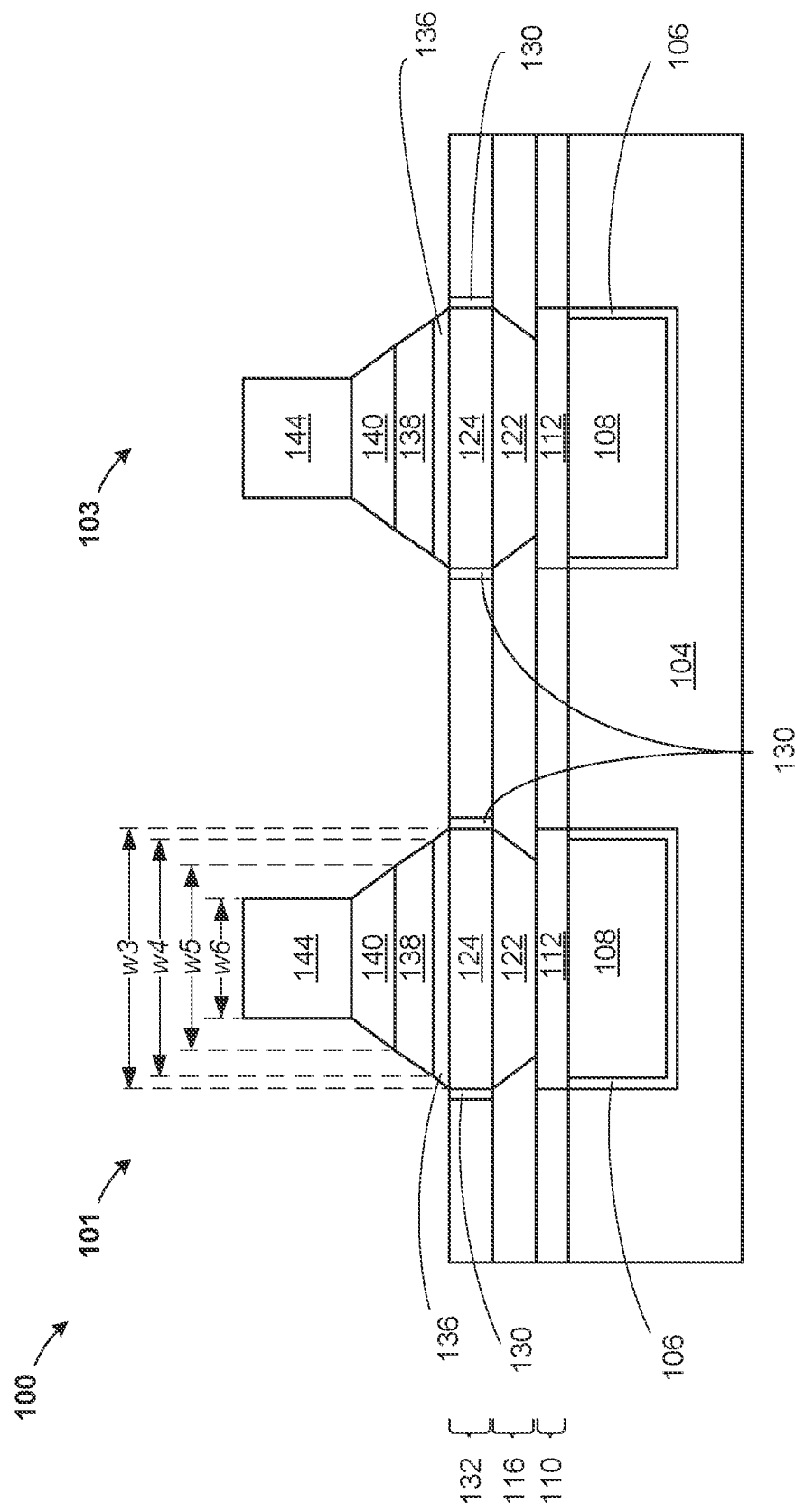
FIG. 11 illustrates a cross-sectional view of the multi-state memory cell and illustrates formation of a hard mask and patterning of the tunneling barrier, the free layer and the top electrode, according to an exemplary embodiment.

Referring now to FIG. 11, a cross-sectional view of the structure 100 is shown, according to an embodiment. A hard mask 144 may be formed. Portions of the top electrode 140, portions of the free layer 138 and portions of the tunneling barrier 136 may be removed.

The hard mask 144 may formed on the structure 100 and patterned, directly on an upper horizontal surface of the top electrode 140. The hard mask 144 may be patterned such that remaining portions of the hard mask 144 are vertically aligned above the reference layer 124, the bottom electrode 122, the metal cap 112 and the lower metal wire 108, in both the cells 101, 103.

The portions of the top electrode 140, the portions of the free layer 138 and the portions of the tunneling barrier 136 are removed selective to the hard mask 144. Remaining portions of the top electrode 140, the free layer 138 and the tunneling barrier 136 may have a tapered side surface which is wider at a lower surface, closer to the lower metal wire 108, and more narrow at an upper surface, further from the lower metal wire 108.

More specifically, a lower horizontal surface width, w3, of the tunneling barrier 136 is larger than an upper horizontal width, w4, of the tunneling barrier 136. A lower horizontal surface width, w4, of the free layer 138 is larger than an upper horizontal width, w5, of the free layer 138. A lower horizontal surface width, w5, of the top electrode 140 is larger than an upper horizontal width, w6, of the top electrode 140.

Vertical sidewalls of the tunneling barrier 136, the free layer 138 and the top electrode 140 may each have the same sidewall angle, which may range between 10 and 50 degrees in an embodiment.

Figure 12:
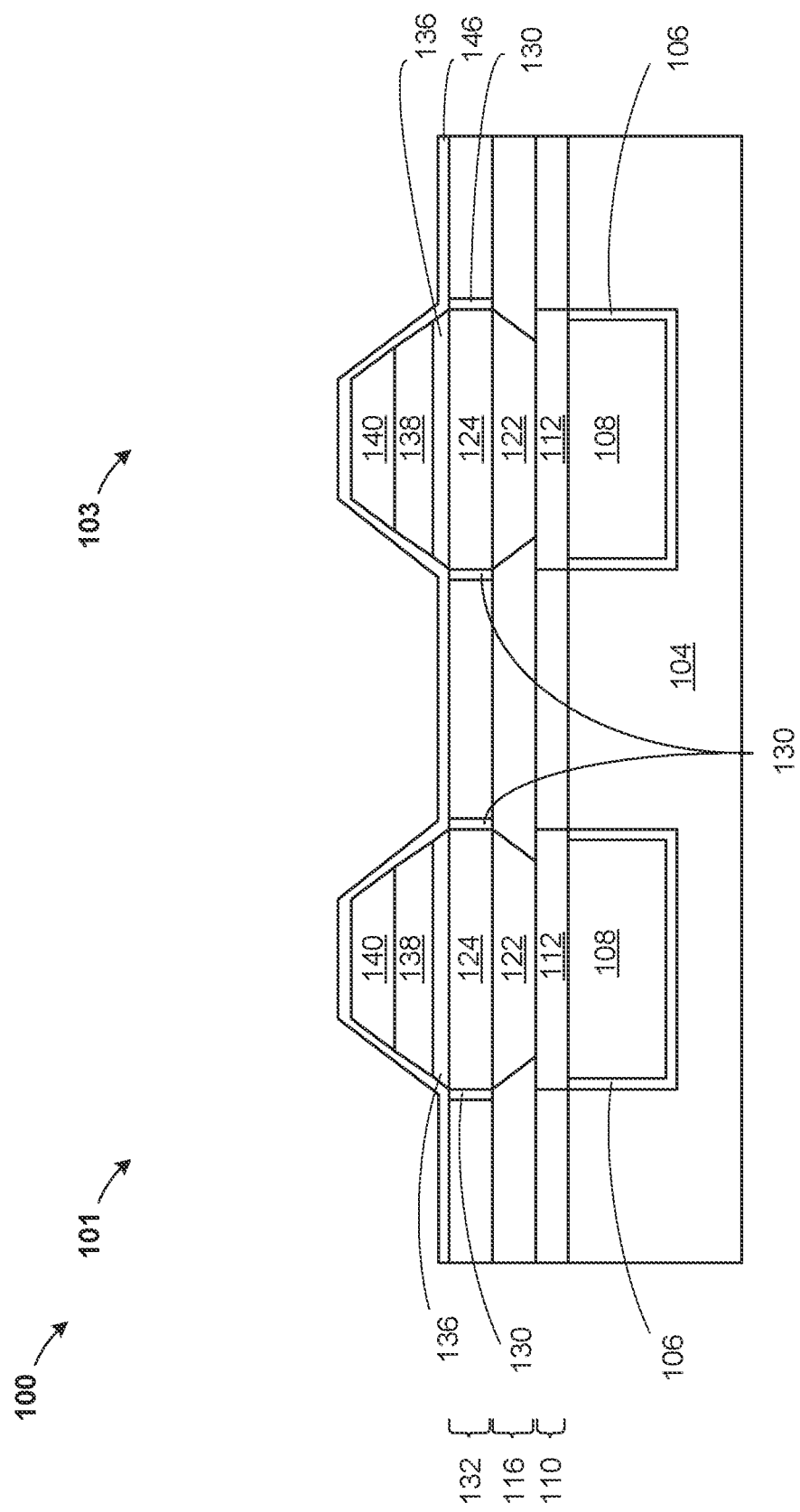
FIG. 12 illustrates a cross-sectional view of the multi-state memory cell and illustrates removal of the hard mask and formation of a second encapsulation layer, according to an exemplary embodiment.

Referring now to FIG. 12, a cross-sectional view of the structure 100 is shown, according to an embodiment. The hard mask 144 may be removed. A second encapsulation layer 146 may be formed.

The second encapsulation layer 146 may be conformably formed on the structure 100, on an upper horizontal surface of the top electrode 140 and the ILD 132, and on vertical side surfaces of the top electrode 140, the free layer 138 and the tunneling barrier 136.

The second encapsulation layer 146 may include materials such as, for example, any dielectric material such as silicon nitride (SiN) and silicon nitride carbon (SiNC) and may include a single layer or may include multiple layers of dielectric material. The second encapsulation layer 146 may be deposited using typical deposition techniques, for example, physical vapor deposition, atomic layer deposition, molecular layer deposition, and chemical vapor deposition. The second encapsulation layer 130 may have a thickness between 3 nm and 30 nm, although thickness greater than 30 nm or less than 3 nm are acceptable.

The second encapsulation layer 146 helps to protect the free layer from being damaged or oxidized during subsequent ILD materials deposition.

Figure 13:
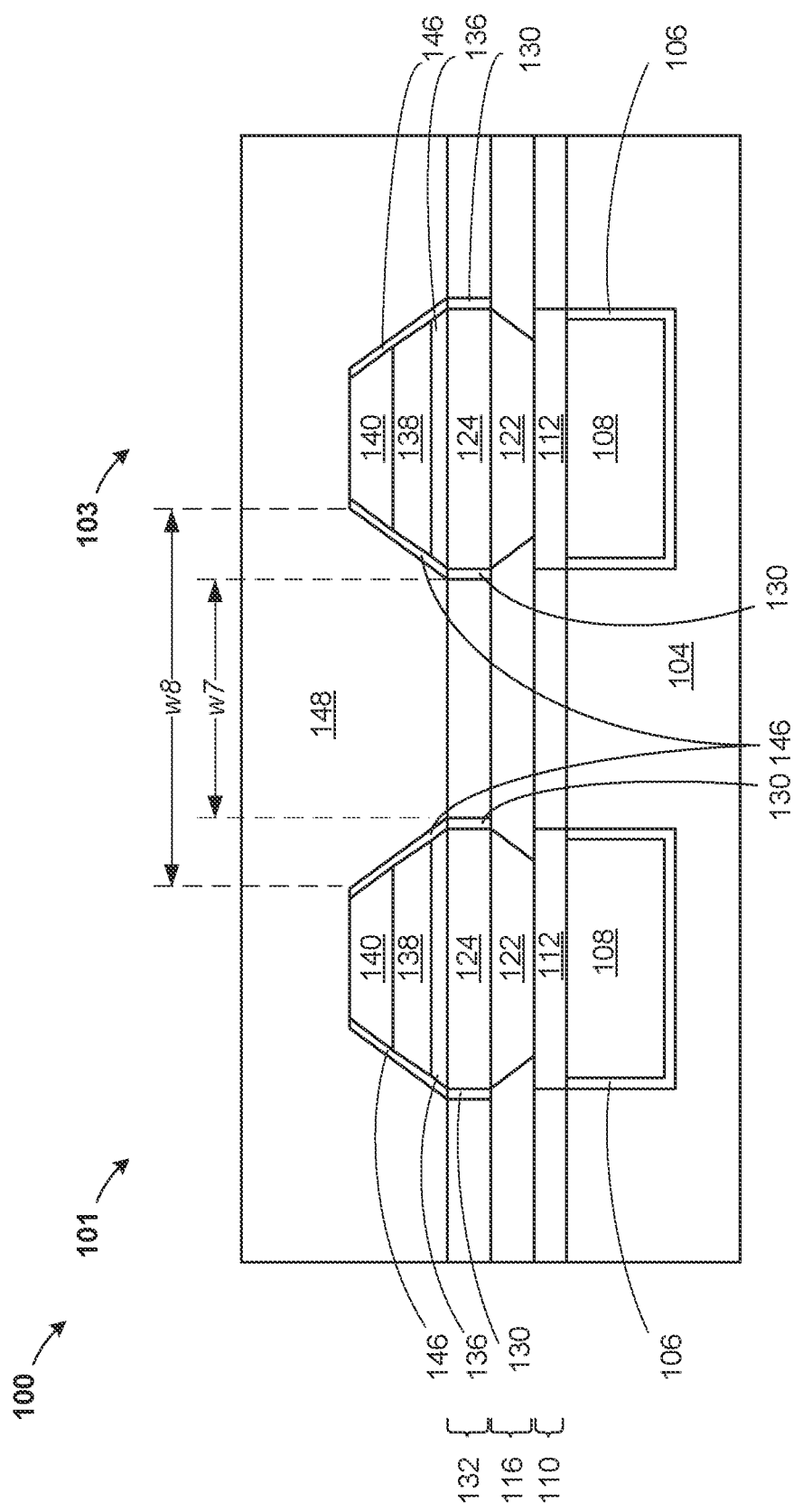
FIG. 13 illustrates a cross-sectional view of the multi-state memory cell and illustrates removal of portions of the first encapsulation layer and formation of an inter-layer dielectric, according to an exemplary embodiment.

Referring now to FIG. 13, a cross-sectional view of the structure 100 is shown, according to an embodiment. Portions of the second encapsulation layer 146 may be removed. An inter-layer dielectric (hereinafter "ILD") 148 may be formed.

The portions of the second encapsulation layer 146 may be selectively removed using an anisotropic etching technique, such as, for example, reactive ion etching. The remaining portions of the second encapsulation layer 146 may remain vertically aligned directly adjacent to the top electrode 140, the free layer 138 and the tunneling barrier 136 in both the cells 101, 103. The second encapsulation layer 146 may be removed from upper horizontal surfaces of the top electrode 140 and the ILD 132.

The ILD 148 may be formed as described for the ILD 104, conformally on the structure 100, covering upper horizontal surfaces of the second encapsulation layer 146, the top electrode 140 and the ILD 132 and vertical side surfaces of the first encapsulation layer 130.

The ILD 148 is unlikely to contain voids as the ILD 148 is blanket deposited on the structure 100 and fills openings between adjacent top electrodes 140, free layers 138 and tunneling barriers 136 within the second encapsulation layer 146 between adjacent cells 101, 103. This is less likely to contain voids than forming an inter-layer dielectric surrounding multiple layers of the cell 101, 103. Additionally, while forming the ILD 148, the ILD 148 first fills a lower width, w7, between cells 101, 103, which is smaller than an upper width, w8, resulting in a lower likelihood of voiding.

Figure 14:
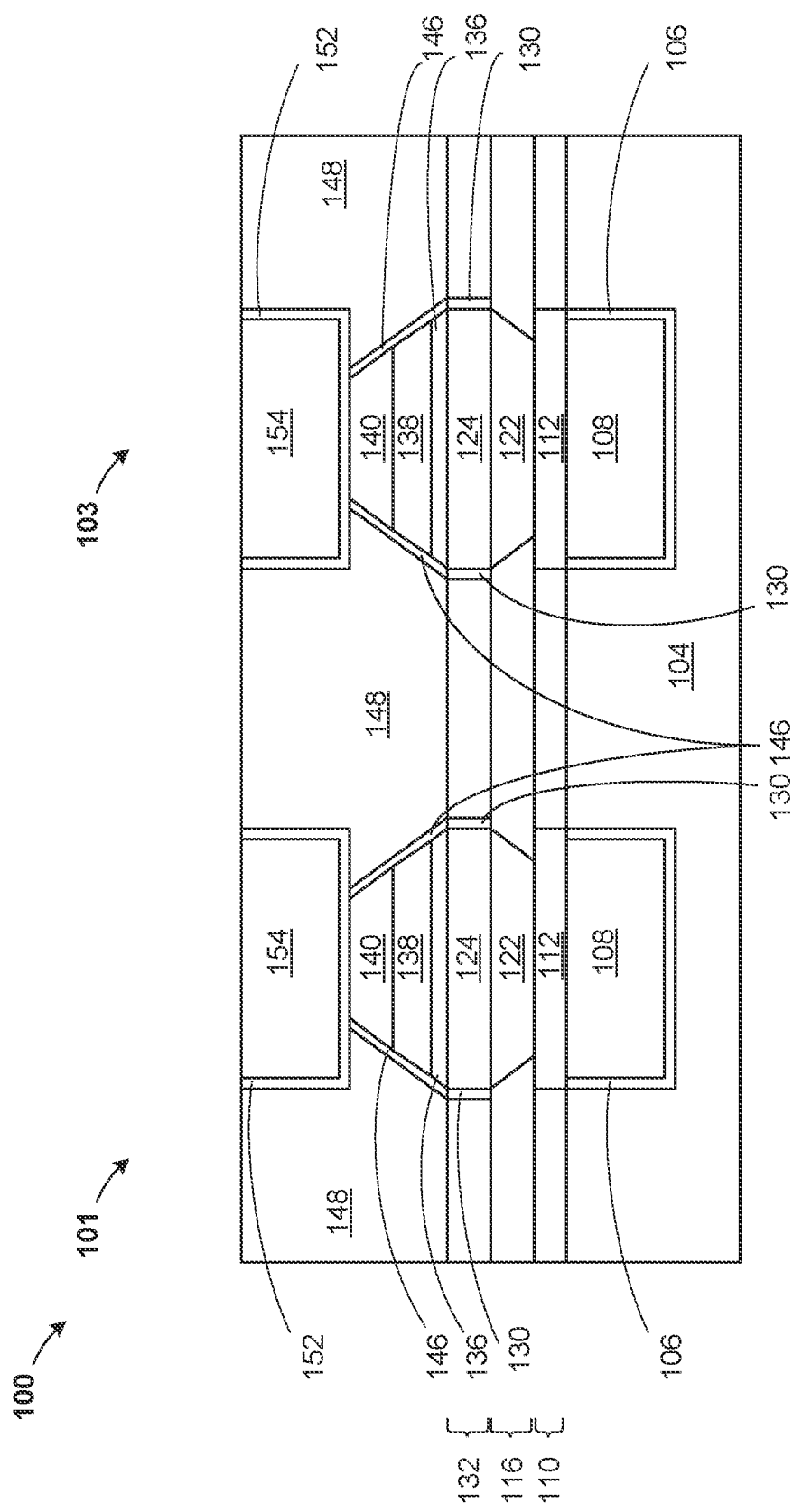
FIG. 14 illustrates a cross-sectional view of the multi-state memory cell and illustrates formation of an upper metal wire, according to an exemplary embodiment.

Referring now to FIG. 14, a cross-sectional view of the structure 100 is shown, according to an embodiment. A liner 152 may be formed. An upper metal wire 154 may be formed.

The upper metal wire 154 may be formed by first patterning two or more trenches (not shown) into the ILD 148, lining the two or more trenches with the liner 152, and filling the two or more trenches.

The liner 152 separates the conductive interconnect material of the upper metal wire 154 from the ILD 148. The liner 152 may be formed as described for the liner 106. The liner 152 surround a lower horizontal surface and a vertical side surface of the upper metal wire 154.

The upper metal wire 154 may be formed as described for the lower metal wire 108. There may be any number of openings in the ILD 148, each lined with the liner 152 and the upper metal wire 154, on the structure 100.

A planarization process, such as, for example, chemical mechanical polishing (CMP), may be done to remove excess material from a top surface of the structure 100 such that upper horizontal surfaces of the upper metal wire 154, the liner 152 and the ILD 148 are coplanar.

The structure 100 has vertically aligned portions of the MTJ stack, including the bottom electrode 122, the reference layer 124, the tunneling barrier 136, the free layer 138 and the top electrode 140. The MTJ stack is vertically aligned between the lower metal wire 108 and the upper metal wire 154. The vertical side surfaces of the bottom electrode 122 have been individually formed with a tapered side surface wider at an upper surface. The reference layer 124 has a vertical side surface perpendicular to an upper surface of the lower metal wire 180 and is surrounded by the first encapsulation layer 130. The tunneling layer 146, the free layer 138 and the top electrode 140 have been individually formed with a tapered side surface more narrow at an upper surface of each layer, with a consistent angle of the tapered side surface for all three layers. The tunneling layer 146, the free layer 138 and the top electrode 140 are surrounded by the second encapsulation layer 146. The resulting side surface of the MTJ stack has an octagon profile.

An MRAM pillar having an octagon profile helps to reduce ILD voiding between adjacent MTJ stacks. This helps to extend scalability of MRAM device memory elements due to void-free gap fill between MRAM pillars and improved embedded MRAM performance due to reduced top contact shorts.

A cross section of each cell 101, 103 has an octagon profile. The octagon profile of each cell 101, 103, includes eight surfaces. The eight surfaces include the lower horizontal surface of the bottom electrode 122, a first vertical side surface of the bottom electrode 122, a first vertical side surface of the reference layer 124, a first combined vertical side surface of the tunneling barrier 136, the free layer 138 and the top electrode 140, an upper horizontal surface of the top electrode 140, a second combined vertical side surface of the top electrode 140, the free layer 138 and the tunneling barrier 136, a second vertical side surface of the reference layer 124 and a second vertical side surface of the bottom electrode 122.

Additionally, the structure 100 has inter-layer dielectric layers formed separately, with the ILD 130 surrounding the bottom electrode 122, the ILD 132 surrounding the reference layer 124 and the ILD 148 surrounding the first encapsulation layer 146, the free layer 138 and the top electrode 140. Each of the ILDs 130, 132, 148 are formed individually and have less voiding of an inter-layer dielectric formed at one time for a same total volume of ILD for the entire MTJ stack, for each cell 101, 103.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
   a magnetic tunnel junction (MTJ) stack, wherein a cross section of the MTJ stack comprises an octagon profile;
   the MTJ stack comprises vertically aligned layers of a top electrode, a free layer, a tunneling barrier, a reference layer and a bottom electrode;
   the bottom electrode comprises a tapered side surface comprising a width at an upper surface of the bottom electrode greater than a width at a lower surface of the bottom electrode;
   the reference layer comprises a vertical side surface perpendicular to an upper horizontal surface of the bottom electrode; and
   the top electrode, the free layer and the tunneling barrier, each comprise a tapered side surface of the same angle, and each comprise a width at an upper surface less than a width at a lower surface.

2. The semiconductor device according to claim 1, further comprising:
   a first encapsulation layer surrounding vertical side surfaces of the reference layer.

3. The semiconductor device according to claim 1, further comprising:
   a second encapsulation layer surrounding vertical side surfaces of the top electrode, the free layer and the tunneling barrier.

4. The semiconductor device according to claim 1, further comprising:
   a first inter-layer dielectric surrounding the bottom electrode;
   a second inter-layer dielectric surrounding the reference layer; and
   a third inter-layer dielectric surrounding the top electrode, the free layer and the tunneling barrier.

5. A semiconductor device comprising:
   a magnetic tunnel junction (MTJ) stack comprising vertically aligned layers of a top electrode, a free layer, a tunneling barrier, a reference layer and a bottom electrode, wherein a cross section of the vertically aligned layers the MTJ stack comprises an octagon profile, wherein the top electrode, the free layer and the tunneling barrier each comprise a tapered side surface of the same angle, and each comprise a width at an upper surface less than a width at a lower surface; and a first encapsulation layer surrounding vertical side surfaces of the reference layer.

6. The semiconductor device according to claim 5, further comprising:

the bottom electrode comprises a tapered side surface comprising a width at an upper surface of the bottom electrode greater than a width at a lower surface of the bottom electrode.

7. The semiconductor device according to claim 5, further comprising:

the reference layer comprises a vertical side surface perpendicular to an upper horizontal surface of the bottom electrode.

8. The semiconductor device according to claim 5, further comprising:

a second encapsulation layer surrounding vertical side surfaces of the top electrode, the free layer and the tunneling barrier.

9. The semiconductor device according to claim 5, further comprising:

a first inter-layer dielectric surrounding the bottom electrode;

a second inter-layer dielectric surrounding the reference layer; and a third inter-layer dielectric surrounding the top electrode, the free layer and the tunneling barrier.

10. A semiconductor device comprising:

a magnetic tunnel junction (MTJ) stack comprising vertically aligned layers of a top electrode, a free layer, a tunneling barrier, and a reference layer, wherein the top electrode, the free layer and the tunneling barrier each comprise a tapered side surface of the same angle, and each comprise a width at an upper surface less than a width at a lower surface, and wherein the reference layer comprises a vertical side surface perpendicular to an upper horizontal surface of a bottom electrode.

11. The semiconductor device according to claim 10, further comprising:

a bottom electrode comprising a tapered side surface and a width at an upper surface of the bottom electrode greater than a width at a lower surface of the bottom electrode.

12. The semiconductor device according to claim 10, further comprising:

a second encapsulation layer surrounding vertical side surfaces of the top electrode, the free layer and the tunneling barrier.

13. The semiconductor device according to claim 10, further comprising:

a first inter-layer dielectric surrounding a bottom electrode;

a second inter-layer dielectric surrounding a reference layer, and a third inter-layer dielectric surrounding the top electrode, the free layer and the tunneling barrier.

* * * * *